United States Patent [19]

Flowers

[11] 3,954,498

[45] May 4, 1976

[54] ALUMINUM FOIL CLEANING PROCESS

[75] Inventor: Dervin L. Flowers, Scottsdale, Ariz.

[73] Assignee: Motorola Inc., Chicago, Ill.

[22] Filed: Oct. 3, 1974

[21] Appl. No.: 511,817

[52] U.S. Cl.................................. 134/2; 252/79.1
[51] Int. Cl.². ............................................ C23G 1/00
[58] Field of Search ................ 134/2, 3; 252/79.1, 252/95, 103; 156/20

[56] References Cited
UNITED STATES PATENTS

| | | | |
|---|---|---|---|
| 2,567,835 | 9/1951 | Alquist et al. | 134/2 |
| 2,678,876 | 5/1954 | Burnside | 252/79.1 |
| 2,795,490 | 6/1957 | Newman et al. | 134/2 UX |
| 3,048,547 | 8/1962 | Vosbigian | 134/2 UX |
| 3,051,603 | 8/1962 | Michaels | 134/3 X |
| 3,140,203 | 7/1964 | Grunwald | 134/3 |
| 3,345,217 | 10/1967 | Wollgien et al. | 134/3 X |
| 3,634,262 | 1/1972 | Grunwald et al. | 134/3 X |

*Primary Examiner*—Morris O. Wolk
*Assistant Examiner*—Arnold Turk
*Attorney, Agent, or Firm*—Henry T. Olsen; Harry M. Weiss

[57] ABSTRACT

A process for preparing an aluminum foil for coating with photoresist for the purpose of preparing an etched strip for semiconductor assembly utilizing the step of cleaning said aluminum surface with a water solution comprising one to five percent ammonium persulfate, one to five percent sodium chlorate and one to three percent of a surfactant selected from the group consisting of dioctyl sodium sulfo succinate and dodecyl benzene sulfonate.

5 Claims, No Drawings

ALUMINUM FOIL CLEANING PROCESS

RELATED APPLICATIONS

This application is related to pending application Ser. No. 485,690, filed July 2, 1974; Ser. No. 488,607, filed July 12, 1974 and Ser. No. 494,783, filed Aug. 5, 1974.

BACKGROUND OF THE INVENTION

This invention relates to the assembly of semiconductor devices, and more particularly to the assembly of semiconductor devices including the process of etching aluminum foil which invention more particularly relates to the process of cleaning the aluminum foil prior to the aluminum etch in preparation for such assembly process.

As will be understood by reference to the foregoing related patent applications in the assembly of semiconductor devices, it is necessary to prepare an aluminum foil by etching of bonding fingers therein for assembly to a semiconductor chip and to a lead frame for encapsulation. The aluminum foil utilized in such process is typically made by reducing thick ingots to foil in a rolling mill operation. To accomplish this, several types of cutting oils and lubricants are used to aid the rolling process. In some cases, heat is also employed. As a result, the surface of the foil is covered and embedded with a greasy, oxide mixed, rolled scored surface. Since the etch strip process requires coating of the foil with a photoresist, the greasy oxide, rolled scored surface of the foil is difficult to coat in good quality with the photoresist. The photoresist must have sufficient adhesion to undergo the further processing, i.e., align and expose, acid etch, etc., to define the lead properly for the etch strip assembly process. If the aluminum surface is not properly cleaned prior to the application of the photoresist, blisters, poor adhesion and brittleness of the photoresist results.

SUMMARY OF THE INVENTION

It is an object of this invention to provide an improved process for the cleaning of an aluminum surface.

It is a further object of this invention to provide an improved process of cleaning of the surface of an aluminum foil.

A further object of the invention is to provide an improved cleaning process for the cleaning of the aluminum foil used in an etched strip semiconductor assembly process.

In accordance with the foregoing objects, there is provided a process of cleaning an aluminum surface which includes the step of subjecting the aluminum surface to an aqueous solution of one to five percent ammonium persulfate, one to five percent sodium chlorate and one to three percent of a surfactant selected from the group consisting of dioctyl sodium sulfo succinate and dodecyl benzene sulfonate prior to coating of the aluminum foil with a photoresist. For etching, the parts are rinsed in hot water and cold water and then blown dry.

COMPLETE DESCRIPTION

The most common use of aluminum in the semiconductor industry has been for the metallization patterns on semiconductor devices, and more particularly, integrated circuits, and for the bonding wires thereto. The metallization patterns have been formed by deposition of aluminum film over the semiconductor device and then suitable patterning by covering the aluminum layer with a photosensitive layer which is exposed, developed and the wafer is placed in an etch solution to delineate the metallization pattern.

Also, to eliminate the usual bonding wires between the semiconductor chip and the lead frame, it has been previously suggested that a thin intermediate form of lead frame or "spider" be utilized or that a metal pattern on a plastic strip be utilized for this purpose. Such an intermediate connection pattern has been formed by stamping, which is a rather imprecise, expensive method or by etching of various metal patterns of, for example, aluminum.

To accomplish this etching by an appropriate solution, it is necessary to apply a coating of photoresist thereto, expose the photoresist to a suitable photographic mask, develop the photoresist and etch the aluminum in accordance with various processes and etches referred to in the above-mentioned related applications.

To accomplish this purpose in the necessary economic and precise manner necessary, it is required that the photoresist be strongly adherent to the aluminum foil. Since the aluminum foil is ordinarily made by reducing thick ingots of aluminum to foil in a rolling mill operation, these aluminum foils are necessarily extremely "dirty" as regards any precise etching characteristics thereof. For example, in rolling of the aluminum foil, it is usually necessary to employ several types of cutting oils and lubricants to aid the rolling process. In some cases, heating of the aluminum foil by exposed gas flames is utilized. This results in a surface of aluminum foil which is covered and embedded with grease, aluminum oxide and the scoring effects of the rolling mill, per se. With such a surface, it is required that suitable surface treatment be given to the aluminum foil prior to application of the photoresist material to provide good adhesion and good uniformity to the coating.

In accordance with the invention, an aluminum foil utilizable for the assembly of semiconductor devices is subjected to an aqueous solution containing one to five percent ammonium persulfate, one to five percent sodium chlorate together with a surfactant such as dioctyl sodium sulfo succinate or dodecyl benzene sulfonate at a slightly elevated temperature, between 30°–100°C for example, 50°C. When so treated, it has been found that the aluminum foil may be readily coated with a suitable photoresist such as Shipley Company's AZ119A providing good adhesion, excellent patterning and excellent etch results when subsequently subjected to the aluminum etchants of the foregoing related patent applications.

To demonstrate the effectiveness of the foregoing process, the foregoing examples of the process and comparative treatments are given in the following chart.

| CLEANING MATERIAL | CONC. | TEMP (°C) | TIME (MIN) | RESULT |
|---|---|---|---|---|
| 1. No treatment | 0 | 50 | 5 | No adhesion |
| 2. AOT (dioctyl sodium sulfo succinate) (American Cyanimid) | 2–5% | 50 | 5 | Blisters and poor adhesion |
| 3. Dodecyl Benzene sulfonate (DBS) | 2–5% | 50 | 5 | Blisters and poor adhesion |
| 4. $NaClO_3$ | 5% | 50 | 5 | Poor adhesion, brittle pattern |
| 5. $(NH_4)_2S_2O_8$ | 5% | 50 | 5 | Poor adhesion, brittle pattern |
| 6. $NaClO_3$ + AOT | 3+5% | 50 | 5 | Poor adhesion, brittle pattern |
| 7. $(NH_4)_2S_2O_8$ + AOT | 3+5% | 50 | 5 | Poor adhesion, brittle pattern |
| 8. $(NH_4)_2S_2O_8$ / $NaClO_3$ / AOT | 2 / 2 / 2 | 50 | 5 | Good adhesion, perfect pattern, excellent etch results |
| 9. $(NH_4)_2S_2O_8$ / $NaClO_3$ / AOT | 3 / 3 / 3 | 50 | 4 | Good adhesion, perfect pattern, excellent etch results |
| 10. $(NH_4)_2S_2O_8$ / $NaClO_3$ / AOT | 2 / 2 / 2 | 60 | 3 | Good adhesion, perfect pattern, excellent etch results |
| 11. $(NH_4)_2S_2O_8$ / $NaClO_3$ / DBS | 2 / 2 / 2 | 50 | 5 | Good adhesion, perfect pattern, excellent etch results |
| 12. $(NH_4)_2S_2O_8$ / $NaClO_3$ / DBS | 3 / 3 / 3 | 50 | 4 | Good adhesion, perfect pattern, excellent etch results |
| 13. $(NH_4)_2S_2O_8$ / $NaClO_3$ / DBS | 1.5 / 1.5 / 2.0 | 50 | 6 | Good adhesion, perfect pattern, excellent etch results |

It will thus be seen from the foregoing, that there is provided synergistic combination oxidants, together with a surfactant, which provides excellent results for the purpose of assembly of semiconductor devices which elements taken alone do not provide the same results. While the invention has been disclosed by way of the preferred embodiment thereof, it will be understood that suitable modifications may be made therein without departing from the spirit and scope of the invention.

What is claimed is:

1. A process for preparing an aluminum foil for coating with photoresist for the purpose of preparing an etched strip for semiconductor assembly comprising the step of cleaning said aluminum foil with a water solution comprising one to five percent ammonium persulfate, one to five percent sodium chlorate and one to three percent of a surfactant selected from the group consisting of dioctyl sodium sulfo succinate and dodecyl benzene sulfonate.

2. A process as recited in claim 1 wherein said solution is heated to about 50°C.

3. A process of cleaning an aluminum surface comprising the step of cleaning said aluminum surface with a water solution comprising one to 5 percent ammonium persulfate, one to five percent sodium chlorate and one to three percent of a surfactant selected from the group consisting of dioctyl sodium sulfo succinate and dodecyl benzene sulfonate.

4. A process as recited in claim 3 wherein said solution is heated to about 50°C.

5. A process as recited in claim 3 wherein said solution comprises three percent ammonium persulfate and three percent sodium chlorate and said solution is heated to a temperature between 30° – 100°C.

* * * * *